(12) United States Patent
Gamo et al.

(10) Patent No.: US 7,084,037 B2
(45) Date of Patent: Aug. 1, 2006

(54) SEMICONDUCTOR DEVICE AND METHOD OF MANUFACTURING THE SAME

(76) Inventors: Yasuo Gamo, Kamikodanaka 4-chome, Nakahara-ku, Kawasaki-shi, Kanagawa 211-8588 (JP); Koji Takahashi, Kamikodanaka 4-chome, Nakahara-ku, Kawasaki-shi, Kanagawa 211-8588 (JP)

( * ) Notice: Subject to any disclaimer, the term of this patent is extended or adjusted under 35 U.S.C. 154(b) by 0 days.

(21) Appl. No.: 10/986,652

(22) Filed: Nov. 12, 2004

(65) Prior Publication Data

US 2005/0087778 A1 Apr. 28, 2005

Related U.S. Application Data

(62) Division of application No. 09/922,786, filed on Aug. 7, 2001, now abandoned.

(30) Foreign Application Priority Data

Mar. 16, 2001 (JP) ............................. 2001-076585

(51) Int. Cl.
*H01L 21/336* (2006.01)
(52) U.S. Cl. ................................... 438/287
(58) Field of Classification Search .............. 438/287, 438/299, 301, 302
See application file for complete search history.

(56) References Cited

U.S. PATENT DOCUMENTS

| 5,168,334 | A | | 12/1992 | Mitchell et al. |
| 5,516,707 | A | | 5/1996 | Loh et al. |
| 5,891,774 | A | * | 4/1999 | Ueda et al. ................. 438/264 |
| 5,962,914 | A | | 10/1999 | Gardner et al. |
| 6,188,101 | B1 | | 2/2001 | Wang |
| 6,284,603 | B1 | * | 9/2001 | Ho Simon et al. .......... 438/264 |
| 6,387,766 | B1 | * | 5/2002 | Schumann ................. 438/303 |
| 2002/0123212 | A1 | | 9/2002 | Kunikiyo |

FOREIGN PATENT DOCUMENTS

| DE | 3032364 C3 | 4/1982 |
| JP | 06-283721 | 10/1994 |
| JP | 07-022524 A | 1/1995 |
| JP | 10-116923 A | 5/1998 |
| WO | WO 97/41593 | 11/1997 |

OTHER PUBLICATIONS

Office Action from German Patent Office for Application No. 101 46 013.9-33 dated Jun. 22, 2004.

* cited by examiner

*Primary Examiner*—Scott B. Geyer
(74) *Attorney, Agent, or Firm*—Westerman, Hattori, Daniels & Adrian, LLP.

(57) ABSTRACT

To ensure sufficient electrical insulation between bit and word lines and realize excellent charge holding characteristic by suppressing undesirable bird's beak formation, a buried bit line type flash memory includes bit lines formed by ion-implanting impurities into a semiconductor substrate, said bit lines serving also as sources and drains, and word lines crossing said bit lines and serving also as gate electrodes. After the impurity ion implantation for forming the bit lines and annealing for activating the impurities, an ONO film having a three-layer structure of silicon oxide film/silicon nitride film/silicon oxide film is formed.

16 Claims, 14 Drawing Sheets

NITROGEN IS IMPLANTED INTO THIS REGION

SiO₂ BECOMES THICKER ABOVE SOURCE/DRAIN

SEMICONDUCTOR DEVICE AND METHOD OF MANUFACTURING THE SAME

RELATED APPLICATION

This application is a divisional of U.S. patent application Ser. No. 09/922,786 filed on Aug. 7, 2001, now abandoned, which is hereby incorporated by reference in its entirety.

CROSS-REFERENCE TO RELATED APPLICATIONS

This application is based upon and claims priority of Japanese Patent Application No. 2001-076585, filed on Mar. 16, 2001, the contents being incorporated herein by reference.

BACKGROUND OF THE INVENTION

1. Field of the Invention

The present invention relates to semiconductor devices provided between semiconductor substrates and gate electrodes with multilayer films each including an insulating film having a charge trap function and sandwiched by upper and lower insulating films, and methods of manufacturing the same.

2. Description of the Related Art

Conventionally, as a nonvolatile memory which can hold its stored data even after the power is cut off, a semiconductor memory has been devised, which includes an impurity diffusion layer formed in a semiconductor substrate to serve as bit lines (buried bit lines), and word lines formed over the semiconductor substrate with a capacitive insulating film being interposed between them, so as to run perpendicularly to the bit lines. The structure can be simpler than a two-layer electrode structure such as an EEPROM and is expected to cope with further size reduction and micropatterning of elements.

In this type of semiconductor memories, the capacitive insulating film preferably has a multilayer structure made up from at least three layers, in which an insulating film having a charge trap function, such as a silicon nitride film, is sandwiched by upper and lower insulating films, such as silicon oxide films. As a typical example of the multilayer film known is a structure of silicon oxide film/silicon nitride film/silicon oxide film, i.e., a so-called ONO film, in which a silicon nitride film having a charge trap function is sandwiched by upper and lower silicon oxide films.

In this type of semiconductor memories, since the word lines cross the buried bit lines, which serve as sources and drains, with the multilayer film being interposed between them, sufficient electrical insulation must be ensured between the bit lines and the word lines. Conventional methods of manufacturing semiconductor memories having buried bit line structures will be described below from the above viewpoint.

(Prior Art 1)

In this prior art, an ONO film is entirely used as an electrical insulating film between bit and word lines.

More specifically, as shown in FIG. 14A, a silicon oxide film 111, a silicon nitride film 112, and a silicon oxide film 113 are sequentially stacked in this order in an active region on, e.g., a p-type silicon semiconductor substrate 101 to form an ONO film 102. After a resist pattern 103 is formed on the ONO film 102, n-type impurities such as arsenic are ion-implanted into a surface layer of the semiconductor substrate 101 using the resist pattern 103 as a mask under such conditions that the ions can pass through the ONO film 102.

The resist pattern 103 is then removed through an ashing process or the like, and the semiconductor substrate 101 is annealed, thereby forming buried bit lines 104 that serve also as sources and drains.

As shown in FIG. 14B, an electrode material is deposited onto the ONO film 102 and patterned to form word lines 105 that cross the buried bit lines 104 with the ONO film 102 being interposed between them. The word lines 105 serve also as gate electrodes.

After that, post-processes such as formation of an insulating interlayer, contact holes, and various electrical interconnection layers are executed, thereby completing a semiconductor memory.

(Prior Art 2)

In this prior art, only the lowermost silicon oxide film of an ONO film on bit lines is made thicker to ensure electrical insulation.

More specifically, as shown in FIG. 15A, an ONO film 102 is formed in an active region on, e.g., a p-type silicon semiconductor substrate 101. After a resist pattern 103 is formed on the ONO film 102, the upper silicon oxide film 113 and the silicon nitride film 112 of the ONO film 102 are patterned using the resist pattern 103 as a mask, thereby leaving only the lowermost silicon oxide film 111 as it is.

Impurities of n-type such as arsenic are then ion-implanted into a surface layer of the semiconductor substrate 101 using the resist pattern 103 as a mask under such conditions that the ions can pass through the lowermost silicon oxide film 111.

The resist pattern 103 is then removed, and the semiconductor substrate 101 is annealed in an oxidative atmosphere, thereby forming buried bit lines 104 that serve also as sources and drains. At this time, as shown in FIG. 15B, accelerated oxidation occurs at portions of the silicon oxide film 111 above the bit lines 104 through the annealing process due to the presence of arsenic ions in the semiconductor substrate 101. The silicon oxide film 111 thereby has a thickness of about 40 to 60 nm at those portions.

As shown in FIG. 15C, an electrode material is then deposited and patterned to form word lines 105 that cross the buried bit lines 104 with the silicon oxide film 111 being interposed between them. The word lines serve also as gate electrodes.

After that, post-processes such as formation of an insulating interlayer, contact holes, and various electrical interconnection layers are executed, thereby completing a semiconductor memory.

(Prior Art 3)

In this prior art, to ensure electrical insulation, bit lines are formed with a thick silicon oxide film provided thereon.

More specifically, as shown in FIG. 16A, a thin sacrificial oxide film 106 is formed in an active region on, e.g., a p-type silicon semiconductor substrate 101. After a resist pattern 103 is formed on the sacrificial oxide film 106, n-type impurities such as arsenic are ion-implanted into a surface layer of the semiconductor substrate 101 using the resist pattern 103 as a mask under such conditions that the ions can pass through the sacrificial oxide film 106.

As shown in FIG. 16B, the resist pattern 103 is then removed, and the semiconductor substrate 101 is annealed in an oxidative atmosphere, thereby forming buried bit lines 104 that serve also as sources and drains. At this time, accelerated oxidation occurs at portions of the sacrificial oxide film 106 above the bit lines 104 through the annealing process due to the presence of arsenic ions in the semiconductor substrate 101. The sacrificial oxide film 106 thereby has a thickness of about 40 to 60 nm at those portions.

As shown in FIG. 16C, after the portions of the sacrificial oxide film 106 on the channel region is removed, an ONO film 102 is formed on the active region. At this time, the thickness of the sacrificial oxide film 106 above the bit lines 104 increases to about 50 to 90 nm because of the influence of the annealing process in forming the ONO film 102.

As shown in FIG. 16D, an electrode material is then deposited and patterned to form word lines 105 that cross the buried bit lines 104 with the sacrificial oxide film 106 being interposed between them. The word lines serve also as gate electrodes.

After that, post-processes such as formation of an insulating interlayer, contact holes, and various electrical interconnection layers are executed, thereby completing a semiconductor memory.

By any of the above-described manufacturing methods, a semiconductor memory having a buried bit line structure, which can hold electrical insulation between the bit and word lines, may be manufactured. However, the above manufacturing methods have the following problems.

In the manufacturing method described in the prior art 1, since electrical insulation between the bit lines 104 and the word lines 105 are ensured only by the ONO film 102, the breakdown voltage of the ONO film 102 must be made high. In this manufacturing method, however, since arsenic ions are ion-implanted through the ONO film 102 to form the bit lines 104, the ONO film 102 may be inevitably damaged. In addition, since the uppermost silicon oxide film 113 of the ONO film 102 may be partially or fully etched off through a post-process, it is hard to ensure a sufficient breakdown voltage of the ONO film 102.

In the manufacturing method described in the prior art 2, in thickening the silicon oxide film 111 above the bit lines 104 by annealing, only the silicon oxide film 111 is present above the bit lines 104. For this reason, bird's beaks may be formed on both sides of each channel region due to the wraparound by oxygen. In addition, since the peripheral circuit region is normally formed simultaneously with formation of the memory cell region, the silicon oxide film 111 above the bit lines 104 may become thicker (about 100 to 150 nm) through several times of annealing processes in forming the gate insulating films of transistors in the peripheral circuit region, and accordingly, larger bird's beaks may form.

In the manufacturing method described in the prior art 3, due to accelerated oxidation through each annealing process for the impurity diffusion to form the bit lines 104 and the formation of the ONO film 102, the sacrificial oxide film 106 above the bit lines 104 may increase its thickness, and large bird's beaks may also grow.

As described above, in manufacturing a semiconductor memory having a buried bit line structure, it is difficult to ensure electrical insulation between the bit lines and the word lines, or even when electrical insulation can be ensured, it may cause bird's beak formation and considerably degrades the charge holding characteristic. These are serious problems.

SUMMARY OF THE INVENTION

An object of the present invention is to provide a semiconductor device that can sufficiently ensure electrical insulation between bit lines and word lines and realize an excellent charge holding characteristic by suppressing undesirable bird's beak formation, and a method of manufacturing the semiconductor device, in particular, to provide a semiconductor memory having a buried bit line structure.

The present invention provides a semiconductor device in which source and drain regions are formed in a surface layer of a semiconductor substrate, and a gate electrode is formed between the source and drain regions over the semiconductor substrate with a multilayer film being interposed between the gate electrode and the semiconductor substrate. The multilayer film is made up from at least three layers, in which a first insulating film having a charge trap function is sandwiched by second and third insulating films from the upper and lower sides of the first insulating film. The present invention also provides a method of manufacturing the semiconductor device.

According to the present invention, there is provided a semiconductor device manufacturing method comprising a first step of introducing impurities into a surface layer in an active region of a semiconductor substrate and annealing the semiconductor substrate to form source and drain regions, a second step of, after the first step, forming a multilayer film made up from at least three layers, in which a first insulating film having a charge trap function is sandwiched by second and third insulating films from the upper and lower sides of the first insulating film, so as to cover the active region, and a third step of depositing an electrode material on the multilayer film and patterning the electrode material and the multilayer film to form a gate electrode over the semiconductor substrate with the multilayer film being interposed between the gate electrode and the semiconductor substrate.

Preferably in the first step, after the introduction of the impurities, a substance having an accelerated oxidation suppressing function is introduced into the active region, and the semiconductor substrate is annealed to form the source and drain regions.

In introducing the substance having the accelerated oxidation suppressing function into the active region, the substance is preferably ion-implanted obliquely to the surface of the active region.

In the semiconductor device of the present invention, the gate electrode is formed over the semiconductor substrate with the multilayer film being interposed between them, to cross the source and drain regions, and the source and drain regions contain the substance having an accelerated oxidation suppressing function, as well as the impurities.

DETAILED DESCRIPTION OF THE PREFERRED EMBODIMENTS

Hereinafter, preferred embodiments of the present invention will be described in detail with reference to drawings.

First Embodiment

In this embodiment, as a semiconductor device according to the present invention, a so-called buried bit line type flash memory will be described. For convenience, the structure of the flash memory will be described through the manufacturing process.

FIGS. 1A to 1C and 2A and 2B are schematic sectional views illustrating manufacturing steps of the buried bit line type flash memory according to this first embodiment in order.

Figure 1A:
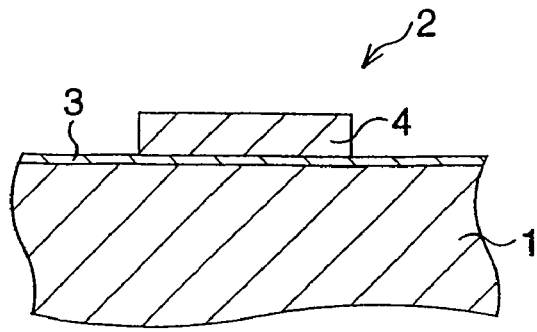
FIGS. 1A to 1C are schematic sectional views illustrating manufacturing steps of a buried bit line type flash memory according to the first embodiment of the present invention.

To manufacture this flash memory, first, as shown in FIG. 1A, a p-type silicon semiconductor substrate 1 is prepared. Field oxide films (not shown) are formed in the element isolation regions on the surface of the semiconductor substrate 1 through, e.g., a LOCOS process for element isolation, thereby defining each active region 2 within a memory cell region and each active region (not shown) within a peripheral circuit region where a CMOS transistor and the like are to be formed.

Instead of using such a LOCOS process, trenches (not shown) may be formed in the element isolation regions of the semiconductor substrate 1, and the trenches may be filled with an insulating material to define active regions.

Annealing is then performed in an oxidative atmosphere at 900° C. to 1,100° C. to form an about 2 to 50 nm-thick sacrificial oxide film 3 on the active region 2. After that, a resist is applied onto the sacrificial oxide film 3 and processed by photolithography to form a resist pattern 4 with band-shape portions separated at predetermined intervals.

Figure 1B:
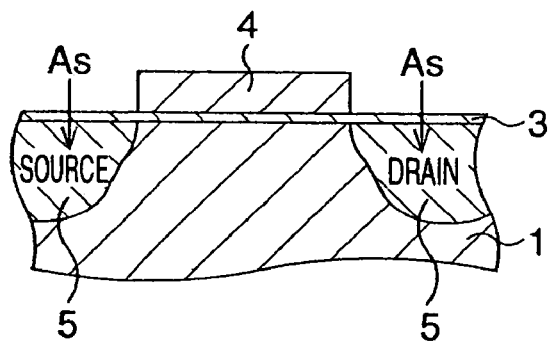

As shown in FIG. 1B, using the resist pattern 4 as a mask, n-type impurities such as arsenic (As) are ion-implanted into a surface layer of the semiconductor substrate 1 under such conditions that the ions can pass through the sacrificial oxide film 3, in this example, at an acceleration energy of 50 keV and a dose of 2 to $3 \times 10^{15}/cm^2$. After the resist pattern 4 is removed by ashing or the like, annealing is performed in a nitrogen atmosphere (or an inert gas atmosphere) at 1,050° C. for 10 min to activate the implanted arsenic ions, thereby forming band-shape bit lines 5. These bit lines 5 serves also as the sources and drains of the flash memory.

Figure 1C:
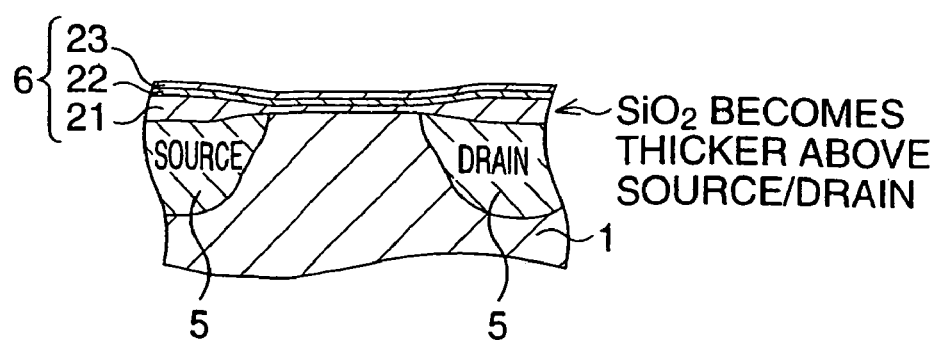

As shown in FIG. 1C, an ONO film 6 having a three-layer structure of silicon oxide film/silicon nitride film/silicon oxide film is formed on the semiconductor substrate 1.

More specifically, first, a silicon oxide film 21 having a thickness of about 7 to 8 nm is formed on the semiconductor substrate 1 by thermal oxidation. At this time, the portions of the silicon oxide film 21 above the bit lines 5 is acceleratingly oxidized through the annealing process due to the presence of arsenic ions in the bit lines 5, thereby increasing the thickness to about 30 to 50 nm.

A silicon nitride film 22 having a thickness of about 5 nm is then formed on the silicon oxide film 21 through a CVD process at 600° C. to 800° C. A silicon oxide film 23 having a thickness of about 10 nm is then formed on the silicon nitride film 22 through a CVD process. The ONO film 6 is formed thus.

The active region 2 of the memory cell region is masked by a resist, and the portions of the ONO film 6 present on the active regions of the peripheral circuit region are all removed using $CF_4+CHF_3O_2$ gas or the like. After the resist on the active region 2 is removed, a gate insulating film (not shown) is formed on the active regions of the peripheral circuit region by thermal oxidation. At this time, since the bit lines 5 are covered with the ONO film 6, the influence of the annealing process in the formation of the gate insulating film is little. Any further accelerated oxidation of the silicon oxide film 21 at the portions above the bit lines 5 is suppressed, and an increase in thickness is hardly observed.

An amorphous silicon (DASi) film (not shown) doped with n-type impurities, in this example, phosphorus (P), at a concentration of 0.2 to $3 \times 10^{21}/cm^3$ and having a thickness of about 100 to 150 nm is formed in each active region of the memory cell region and the peripheral circuit region by CVD.

Figure 2A:
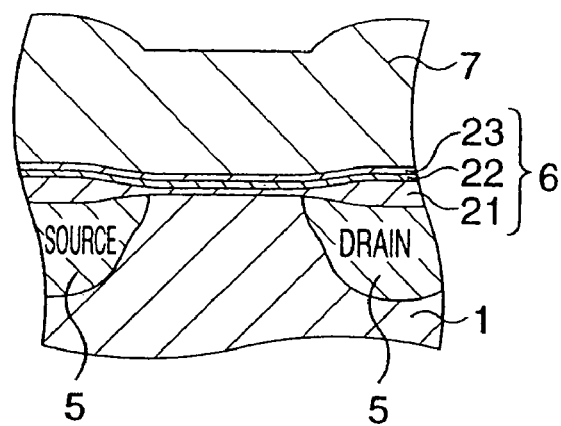
FIGS. 2A and 2B are schematic sectional views illustrating manufacturing steps of the buried bit line type flash memory according to the first embodiment, subsequent to FIG. 1C.
Figure 2B:
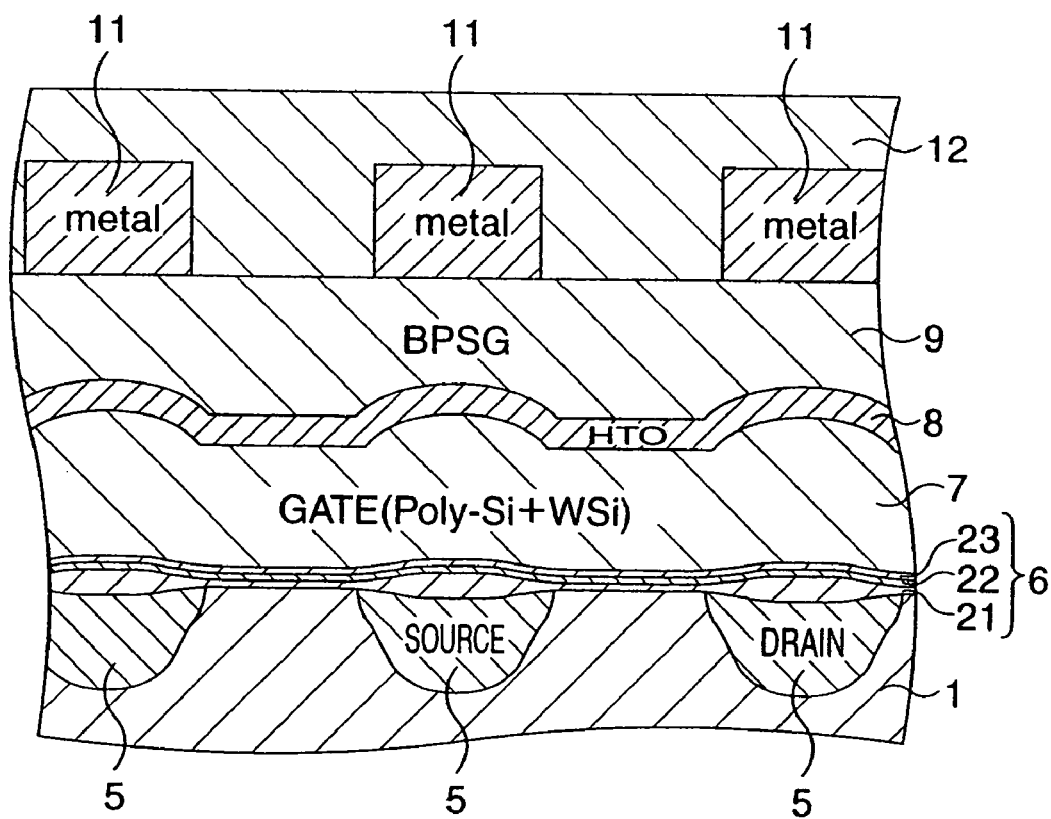
Figure 3:
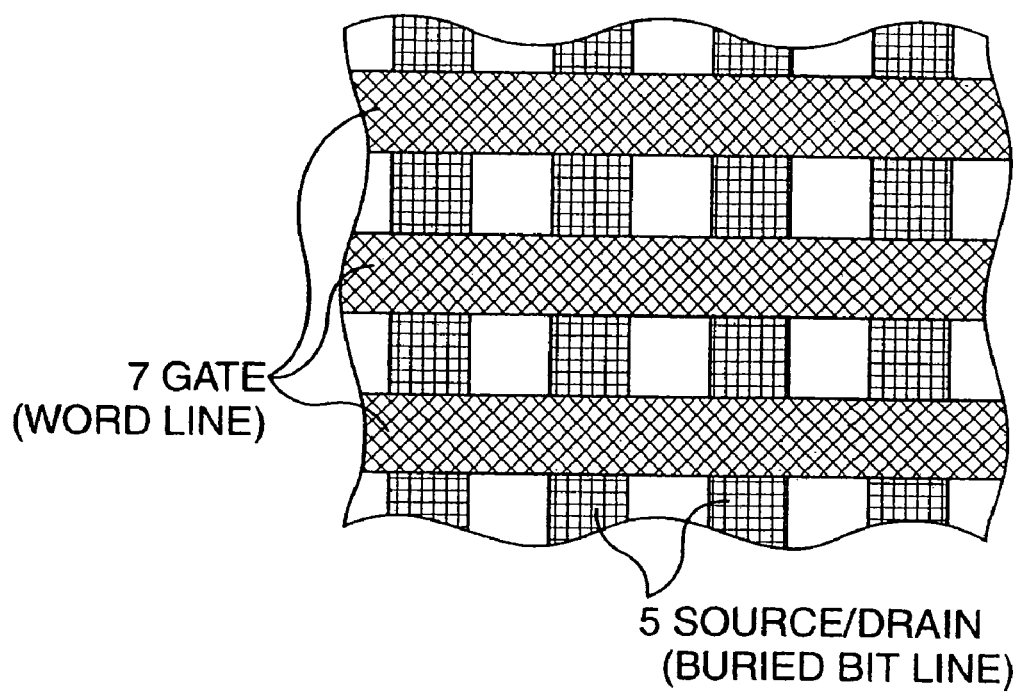
FIG. 3 is a schematic plan view showing a structure in which bit lines and word lines perpendicularly cross each other.

As shown in FIGS. 2A and 3 (plan view), the DASi film is then annealed to form a polysilicon film, and the polysilicon film and the ONO film 6 are patterned by photolithography and subsequent dry etching, thereby forming bandshape word lines 7 that perpendicularly cross the bit lines 5 with the ONO film 6 being interposed between them and serve also as gate electrodes. At this time, a tungsten silicide (WSi) film may be formed on the polysilicon film to form word lines having a polycide structure and thereby decrease the resistance of electrical interconnections As shown in FIG. 2B, a high-temperature CVD oxide film (HTO film) 8 and a BPSG film 9 are sequentially formed in this order to cover the word lines 7. After contact holes (not shown) reaching the word lines 7 and the like are formed, an aluminum alloy film is formed by sputtering on the BPSG film 9, which has been planarized by a reflow process, so as to fill the contact holes. The aluminum alloy film is patterned by photolithography and subsequent dry etching to form upper interconnecting lines 11.

After that, a protective film 12 is formed to cover the upper interconnecting lines 11, and formation processes for an insulating interlayer, contact holes (via holes), and interconnecting lines are executed, thereby completing a buried bit line type flash memory.

Figure 4:
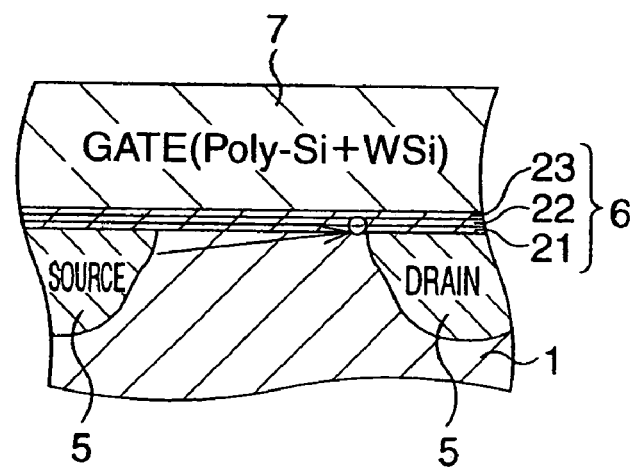
FIG. 4 is a schematic sectional view illustrating a data write operation in the flash memory according to the first embodiment.

To write data in this flash memory, electrons are injected into the drain terminal with channel hot electrons (CHEs) or drain avalanche hot carriers (DAHCs), as shown in FIG. 4. In this case, electrons can be injected into the source terminal by exchanging the source and drain voltages with each other. That is, write operations (electron injection) to two portions in one memory cell can be executed.

Figure 5A:
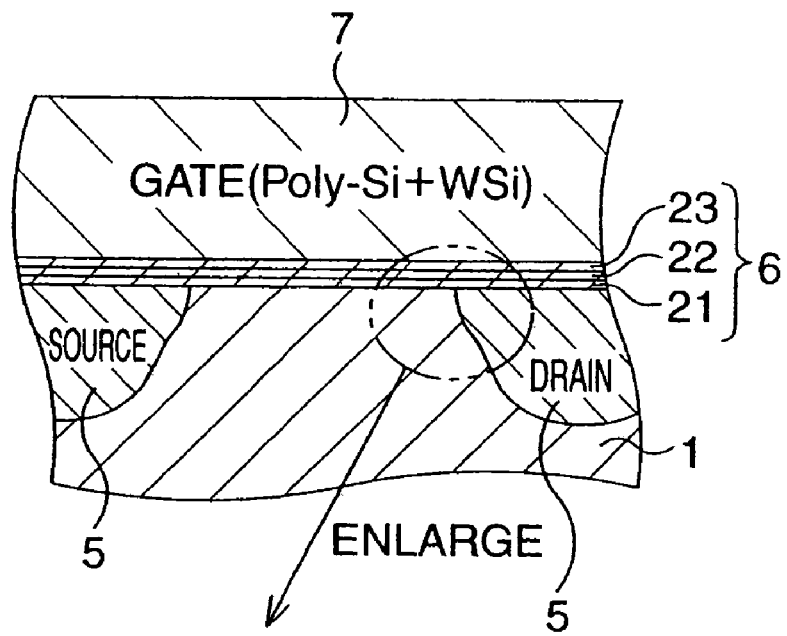
FIGS. 5A and 5B are schematic sectional views illustrating a data erase operation in the flash memory according to the first embodiment.
Figure 5B:
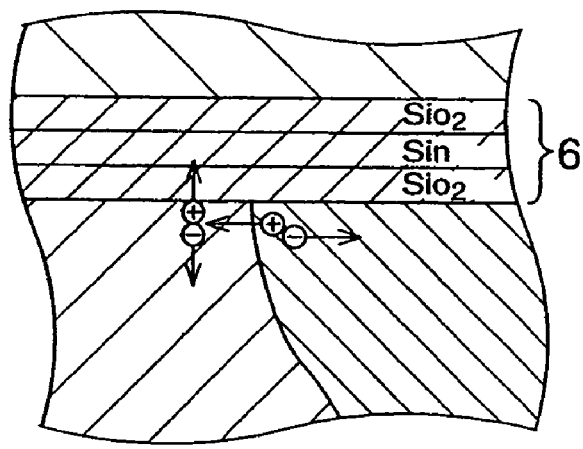

To erase data in this flash memory, as shown in FIGS. 5A and 5B, charges are removed from the ONO film 6 by Fowler-Nordheim (FN) tunneling, or holes generated in the tunnel between bands and hot holes generated due to the electric field between the drain and the substrate are injected into the ONO film 6. The illustrated example shows the latter case by the tunnel between the bands. In this example of erase, electrons are injected into the drain terminal. When an identical voltage is applied also to the source, a flash erase can be executed for the source terminal simultaneously with the drain terminal.

Figure 6A:
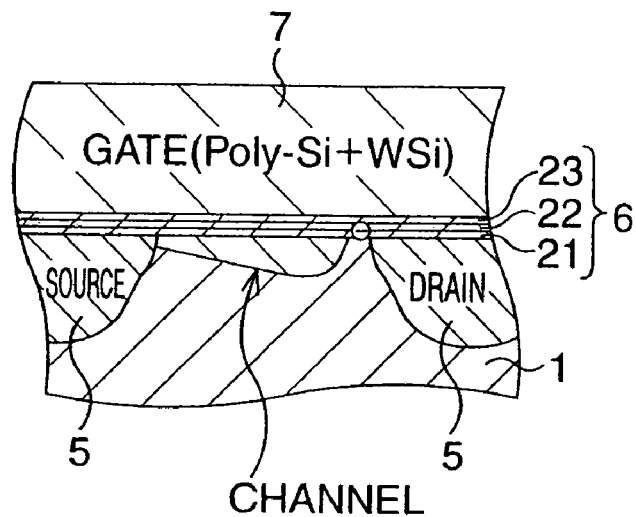
FIGS. 6A and 6B are schematic sectional views illustrating a data read operation in the flash memory according to the first embodiment.
Figure 6B:
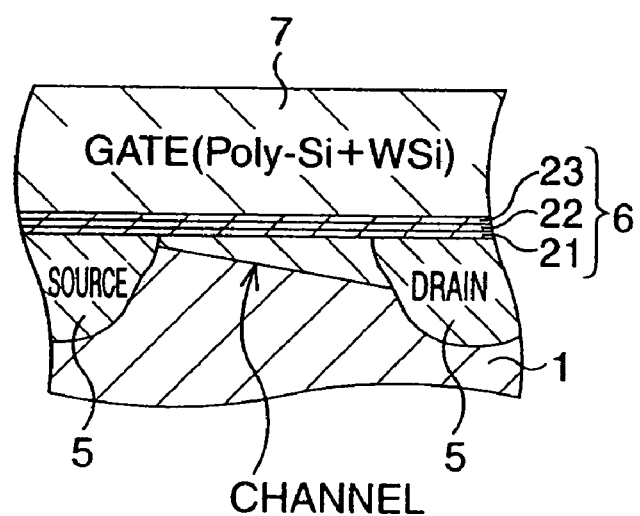

A method of reading out data from this flash memory will be described with reference to FIGS. 6A and 6B. While negative charges are present in the silicon nitride film 22, the channel is cut off, and no current flows between the source and the drain (FIG. 6A). This state is defined as data "0". While no electrons are present in the silicon nitride film 22, the channel is connected, and a current flows (FIG. 6B). This state is defined as data "1".

EXPERIMENTAL EXAMPLES

Experimental results obtained by examining various characteristics of the flash memory according to this first embodiment in comparison with the above-described prior arts will be described. FIGS. 7, 8, and 9A to 9C show the experimental results, in which the above-described prior arts 1 and 2 are respectively referred to as prior arts ① and ② as comparative examples, and the first embodiment of the present invention is referred to as invention ①.

Experimental Example 1

Figure 7:
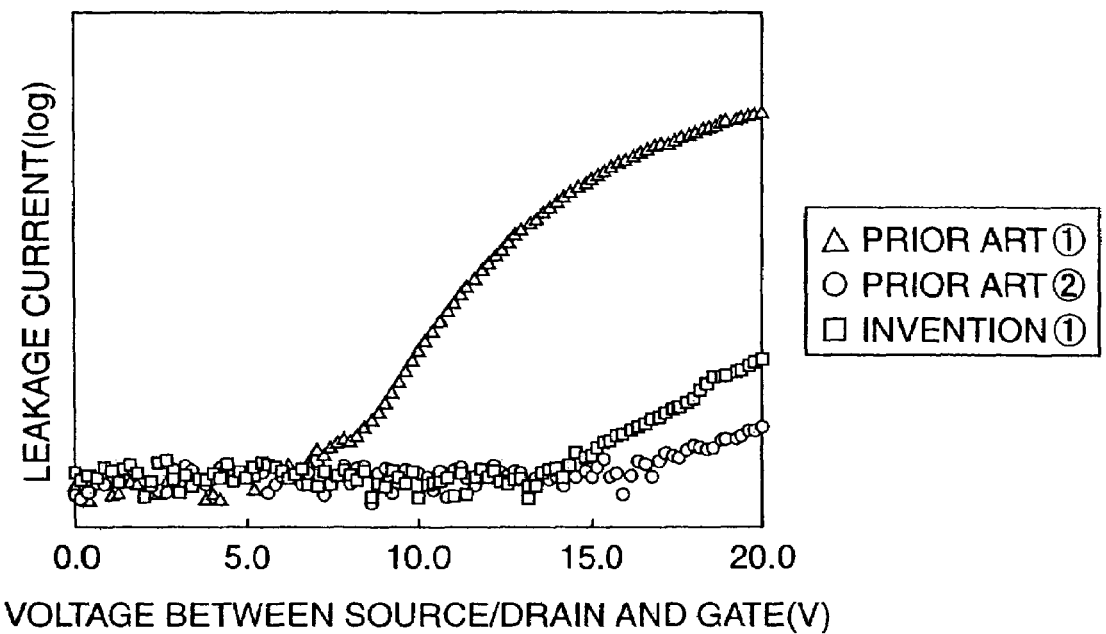
FIG. 7 is a graph showing the relation between the leakage current and the voltage between the source/drain and the gate electrode in the flash memory according to each of the first embodiment and comparative examples.

The relation between the leakage current and the voltage between the source/drain and the gate electrode in the flash memory was examined. The experimental result is shown in FIG. 7. In FIG. 7, the leakage current is logarithmically plotted.

The breakdown voltage of the ONO film had to be about 15 V. As shown in FIG. 7, in the present invention ①, the ensured breakdown voltage was almost the same as that in prior art ② which had the thickest silicon oxide film above the bit lines (sources and drains).

Experimental Example 2

Figure 8:
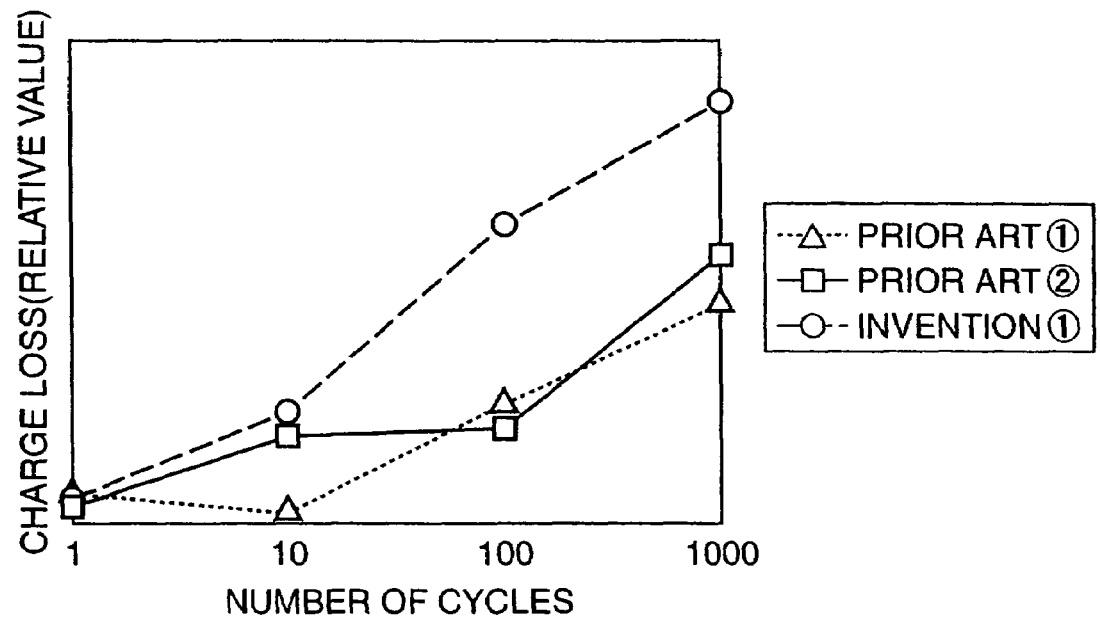
FIG. 8 is a graph showing the relation between the charge holding characteristic and the number of times of data erase/write operations in the flash memory according to each of the first embodiment and the comparative examples.

The relation between the charge holding characteristic and the number of times of data erase/write operations in the flash memory was examined. The experimental result is shown in FIG. 8. In FIG. 8, the charge holding characteristic is plotted as relative values.

After the erase and write process (cycle) was repeated, and annealing was performed at 150° C. for two hours, the charge holding characteristic was examined. As shown in FIG. 8, in the present invention ①, the obtained charge holding characteristic was almost the same as that in prior art ① which had the thinnest silicon oxide film above the bit lines (sources and drains), and so the smallest bird's beak.

Experimental Example 3

Figure 9A:
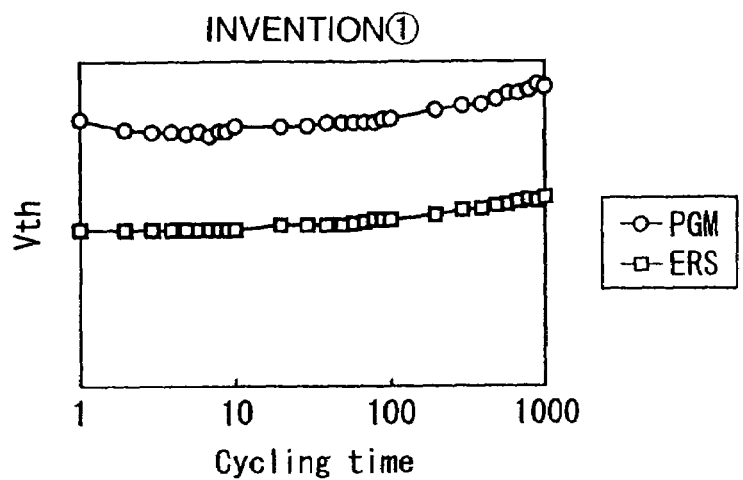
FIGS. 9A to 9C are graphs each showing the relation between the threshold voltage (Vth) and the number of times of data erase/write operations in the flash memory according to the first embodiment and the comparative examples.
Figure 9B:
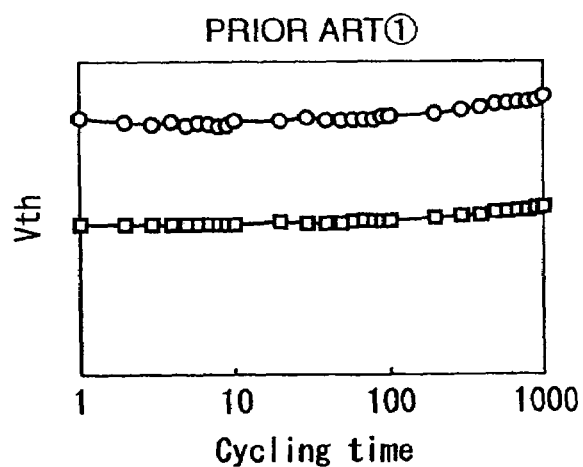
Figure 9C:
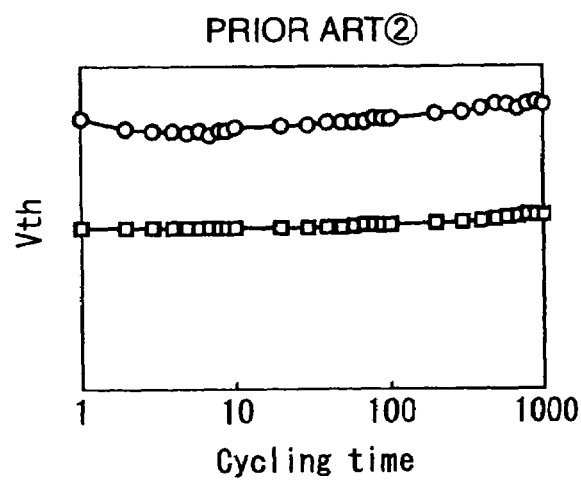

The relation between the threshold voltage ($V_{th}$) and the number of times of data erase/write operations in the flash memory was examined. The experimental results are shown in FIGS. 9A to 9C.

The write conditions were set to Vd=5.9 V, Vg=9.5 V, and write time=3 µs, and the erase conditions were set to Vd=7.0 V, Vg=−3.0 V, and erase time=10 ms. As shown in FIGS. 9A to 9C, no difference in erase/write speed was observed between the present invention ① and prior arts ① and ②. On the basis of this experimental result, the cycle in Experimental Example 2 was done under the same conditions as those described above.

As described above, in this embodiment, the ONO film 6 is formed after the impurities (arsenic) in the bit lines 5 are activated. At the time of formation of the ONO film 6, the silicon oxide film 21 as a component of the ONO film 6 is formed thick only above the bit lines 5 by accelerated oxidation, so that sufficient electrical insulation is ensured between the bit lines 5 and the word lines 7. In this case, in various annealing processes. (formation of the gate insulating film in the peripheral circuit region and the like) after formation of the ONO film 6, since the thick portions of the silicon oxide film 21 above the bit lines 5 are covered with the other components (the silicon nitride film 22 and the silicon oxide film 23) of the ONO film 6, the thick portions of the silicon oxide film 21 are not greatly acceleratingly oxidized, and the bird's beaks can be suppressed to a negligible level.

That is, in this embodiment, throughout the process until the completion of the flash memory, the thickness of the ONO film 6 above the bit lines 5 is kept within an optimum range in which sufficient electrical insulation is ensured between the bit lines 5 and the word lines 7 and no bird's beak that may degrade the charge holding characteristic is formed. Hence, a very reliable flash memory with improved transistor characteristics can be implemented.

Second Embodiment

In this second embodiment, a so-called buried bit line type flash memory will be described, like the first embodiment, though this second embodiment differs from the first embodiment in the bit line formation process. The components of the flash memory according to this second embodiment corresponding to those in the first embodiment are denoted by the same reference numerals as those in the first embodiment.

FIGS. 10A to 10C and 11A and 11B are schematic sectional views illustrating manufacturing steps of the buried bit line type flash memory according to this second embodiment in order.

Figure 10A:
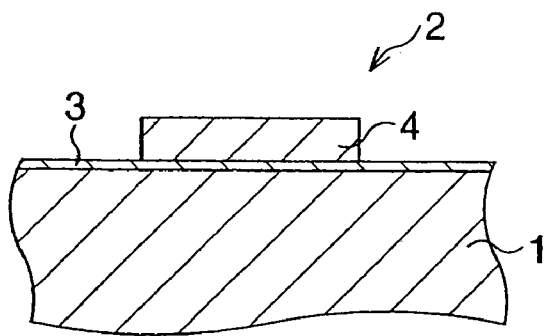
FIGS. 10A to 10C are schematic sectional views illustrating manufacturing steps of a buried bit line type flash memory according to the second embodiment of the present invention.

To manufacture this flash memory, first, as shown in FIG. 10A, a p-type silicon semiconductor substrate 1 is prepared. Field oxide films (not shown) are formed in the element isolation regions on the surface of the semiconductor substrate 1 through, e.g., a LOCOS process for element isolation, thereby defining each active region 2 within a memory cell region and each active region (not shown) within a peripheral circuit region where a CMOS transistor and the like are to be formed.

Instead of using such a LOCOS process, trenches (not shown) may be formed in the element isolation regions of the semiconductor substrate 1, and the trenches may be filled with an insulating material to define active regions.

Annealing is then performed in an oxidative atmosphere at 900° C. to 1,100° C. to form an about 2 to 50 nm-thick sacrificial oxide film 3 on the active region 2. After that, a resist is applied onto the sacrificial oxide film 3 and processed by photolithography to form a resist pattern 4 with band-shape portions separated at predetermined intervals.

Figure 10B:
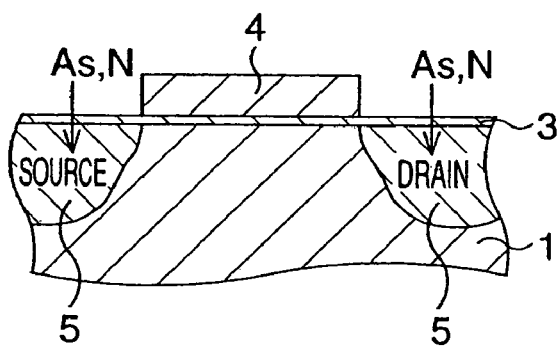

As shown in FIG. 10B, using the resist pattern 4 as a mask, n-type impurities such as arsenic (As) are ion-implanted into a surface layer of the semiconductor substrate 1 under such conditions that the ions can pass through the sacrificial oxide film 3, in this example, at an acceleration energy of 50 keV and a dose of 2 to $3 \times 10^{15}/cm^2$. Subsequently, a substance having an accelerated oxidation suppressing function, in this example, nitrogen ions are implanted at an acceleration energy of 2 to 10 keV and a dose of 0.5 to $4 \times 10^{15}/cm^2$.

The substance having the accelerated oxidation suppressing function can be one selected from nitrogen, carbon, and compounds containing nitrogen or carbon. When annealing is performed in the presence of these impurities, the impurities may concentrate in a surface layer of the semiconductor substrate 1 to form SiN or SiC and thereby suppress the diffusion of oxygen atoms into the semiconductor substrate 1. Hence, carbon may suitably be ion-implanted instead of nitrogen. In addition, the introducing method of such a substance is not limited to the ion implantation method. For example, annealing may be performed in an atmosphere of such a substance to dope the semiconductor substrate 1 with the substance. In this case, the substance having the accelerated oxidation suppressing function is preferably selected from $NO_2$, NO, $NH_3$, and $C_xH_y$ (x and y are appropriate numbers) due to the above-described reason for accelerated oxidation suppression.

After the resist pattern 4 is removed by ashing or the like, annealing is performed in a nitrogen atmosphere (or an inert gas atmosphere) at 1,050° C. for 10 min to activate the implanted arsenic ions, thereby forming band-shape bit lines 5. These bit lines 5 serves also as the sources and drains of the flash memory.

Figure 10C:
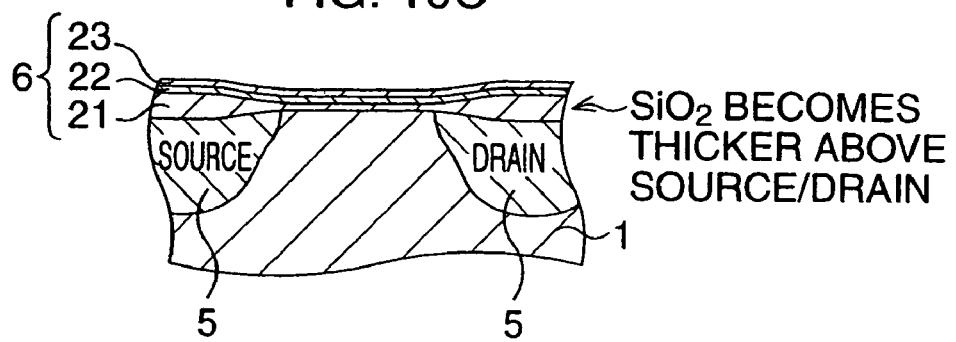

As shown in FIG. 10C, an ONO film 6 having a three-layer structure of silicon oxide film/silicon nitride film/silicon oxide film is formed on the semiconductor substrate 1.

More specifically, first, a silicon oxide film 21 having a thickness of about 7 to 8 nm is formed on the semiconductor substrate 1 by thermal oxidation. At this time, the portions of the silicon oxide film 21 above the bit lines 5 is acceleratingly oxidized through the annealing process due to the presence of arsenic ions in the bit lines 5, thereby increasing the thickness to about 30 to 50 nm. In this case, however, the accelerated oxidation suppressing function of the implanted nitrogen ions further suppresses the increase in thickness of the silicon oxide film 21 in comparison with the first embodiment in which no nitrogen ion implantation is performed.

A silicon nitride film 22 having a thickness of about 5 nm is then formed on the silicon oxide film 21 through a CVD process at 600° C. to 800° C. A silicon oxide film 23 having a thickness of about 10 nm is then formed on the silicon nitride film 22 through a CVD process. The ONO film 6 is formed thus.

The active region 2 of the memory cell region is masked by a resist, and the portions of the ONO film 6 present on the active regions of the peripheral circuit region are all removed using $CF_4+CHF_3/O_2$ gas or the like. After the resist on the active region 2 is removed, a gate insulating film (not shown) is formed on the active regions of the peripheral circuit region by thermal oxidation. At this time, since the bit lines 5 are covered with the ONO film 6, the influence of the annealing process in the formation of the gate insulating film is little. Any further accelerated oxidation of the silicon oxide film 21 at the portions above the bit lines 5 is suppressed, and an increase in thickness is hardly observed.

An amorphous silicon (DASi) film (not shown) doped with n-type impurities, in this example, phosphorus (P), at a concentration of 0.2 to $3 \times 10^{21}/cm^3$ and having a thickness of about 100 to 150 nm is formed in each active region of the memory cell region and the peripheral circuit region by CVD.

Figure 11A:
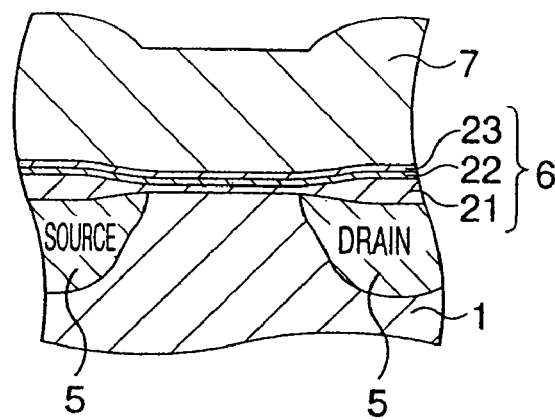
FIGS. 11A and 11B are schematic sectional views illustrating manufacturing steps of the buried bit line type flash memory according to the second embodiment, subsequent to FIG. 10C.

As shown in FIG. 11A, the DASi film is then annealed to form a polysilicon film, and the polysilicon film and the ONO film 6 are patterned by photolithography and subsequent dry etching, thereby forming band-shape word lines 7 that perpendicularly cross the bit lines 5 with the ONO film 6 being interposed between them and serve also as gate electrodes. At this time, a tungsten silicide (WSi) film may be formed on the polysilicon film to form word lines having a polycide structure and thereby decrease the resistance of electrical interconnections.

Figure 11B:
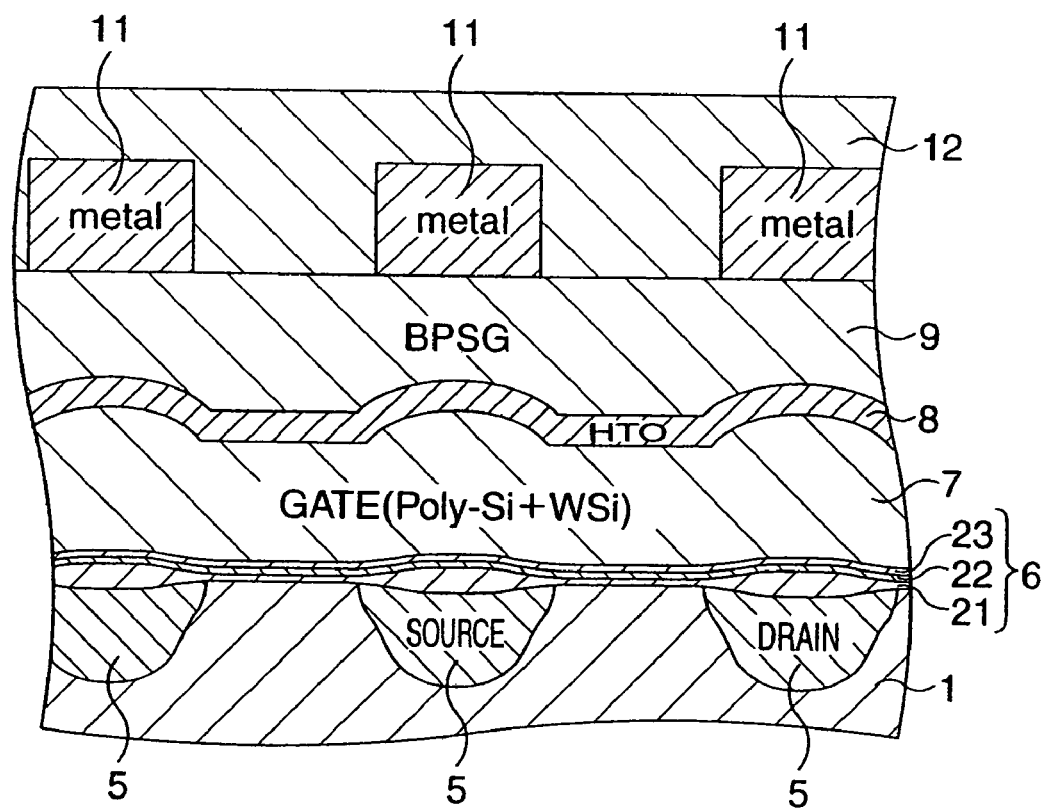

As shown in FIG. 11B, a high-temperature CVD oxide film (HTO film) 8 and a BPSG film 9 are sequentially formed in this order to cover the word lines 7. After contact holes (not shown) reaching the word lines 7 and the like are formed, an aluminum alloy film is formed by sputtering on the BPSG film 9, which has been planarized by a reflow process, so as to fill the contact holes. The aluminum alloy film is patterned by photolithography and subsequent dry etching to form upper interconnecting lines 11.

After that, a protective film 12 is formed to cover the upper interconnecting lines 11, and formation processes for an insulating interlayer, contact holes (via holes), and interconnecting lines are executed, thereby completing a buried bit line type flash memory.

As described above, in this embodiment, the ONO film 6 is formed after the impurities (arsenic) in the bit lines 5 are activated, and nitrogen (carbon) having the accelerated oxidation suppressing function is ion-implanted. At the time of formation of the ONO film 6, the silicon oxide film 21 as a component of the ONO film 6 is formed thick only above the bit lines 5 by accelerated oxidation, so that sufficient electrical insulation is ensured between the bit lines 5 and the word lines 7. In this case, in various annealing processes (formation of the gate insulating film in the peripheral circuit region and the like) after formation of the ONO film 6, since the thick portions of the silicon oxide film 21 above the bit lines 5 are covered with the other components (the silicon nitride film 22 and the silicon oxide film 23) of the ONO film 6, in addition, due to the accelerated oxidation suppressing function of nitrogen (carbon), the thick portions of the silicon oxide film 21 are not greatly acceleratingly oxidized, and bird's beak formation can be suppressed to a negligible level.

That is, in this embodiment, throughout the process until the completion of the flash memory, the thickness of the ONO film 6 above the bit lines 5 is kept within an optimum range in which sufficient electrical insulation is ensured between the bit lines 5 and the word lines 7 and no bird's beak that may degrade the charge holding characteristic is formed. Additionally, the thickness can be controlled thinner by the accelerated oxidation suppressing function of nitrogen (carbon). Hence, a very reliable flash memory with improved transistor characteristics can be implemented.

Third Embodiment

In this third embodiment, a so-called buried bit line type flash memory will be described, like the first embodiment, though this third embodiment differs from the first embodiment in the bit line formation process. The components of the flash memory according to this third embodiment corresponding to those in the first or second embodiment are denoted by the same reference numerals as those in the first or second embodiment.

FIGS. 12A to 12C and 13A and 13B are schematic sectional views illustrating manufacturing steps of the buried bit line type flash memory according to this third embodiment in order.

Figure 12A:
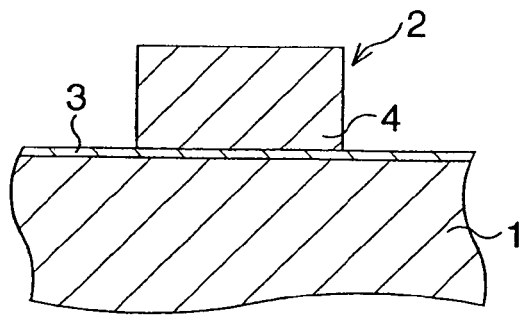
FIGS. 12A to 12C are schematic sectional views illustrating manufacturing steps of a buried bit line type flash memory according to the third embodiment of the present invention.

To manufacture this flash memory, first, as shown in FIG. 12A, a p-type silicon semiconductor substrate 1 is prepared. Field oxide films (not shown) are formed in the element isolation regions on the surface of the semiconductor substrate 1 through, e.g., a LOCOS process for element isolation, thereby defining each active region 2 within a memory cell region and each active region (not shown) within a peripheral circuit region where a CMOS transistor and the like are to be formed.

Instead of using such a LOCOS process, trenches (not shown) may be formed in the element isolation regions of the semiconductor substrate 1, and the trenches may be filled with an insulating material to define active regions.

Annealing is then performed in an oxidative atmosphere at 900° C. to 1,100° C. to form an about 2 to 50 nm-thick sacrificial oxide film 3 on the active region 2. After that, a resist is applied onto the sacrificial oxide film 3 and processed by photolithography to form a resist pattern 4 with band-shape portions separated at predetermined intervals.

Figure 12B:
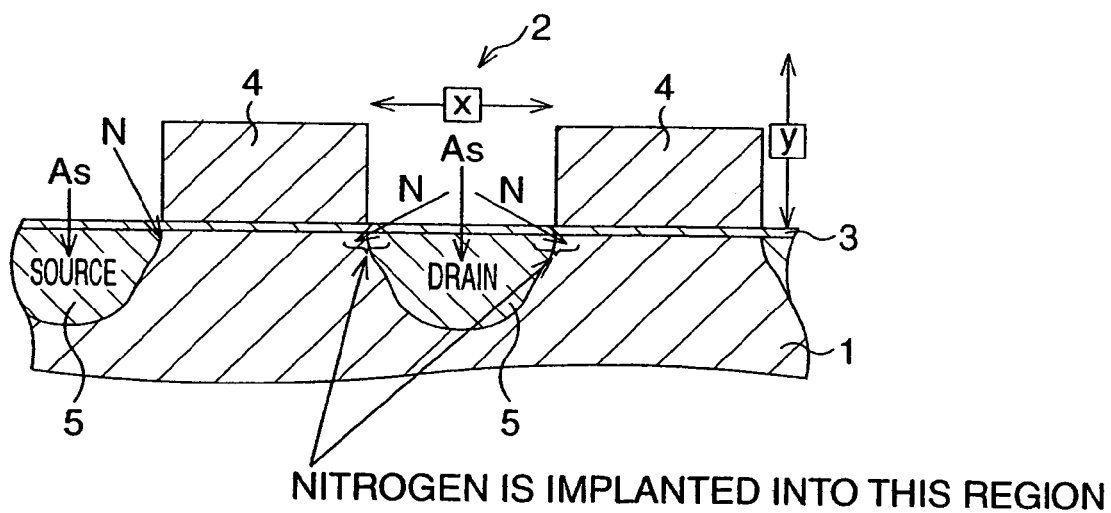

As shown in FIG. 12B, using the resist pattern 4 as a mask, n-type impurities such as arsenic (As) are ion-implanted into a surface layer of the semiconductor substrate 1 under such conditions that the ions can pass through the sacrificial oxide-film 3, in this example, at an acceleration energy of 50 keV and a dose of 2 to $3 \times 10^{15}/cm^2$.

Subsequently, a substance having an accelerated oxidation suppressing function, in this example, nitrogen ions are ion-implanted obliquely to the surface of the semiconductor substrate 1 at an acceleration energy of 2 to 30 keV and a dose of 1 to $5 \times 10^{15}/cm^2$. When x represents the distance between neighboring resist pattern portions 4 (the width of each bit line 5), and y represents the thickness of the resist pattern 4, using an angle θ that generally satisfies;

tan θ=x/y, the angle Σ for implantation of nitrogen ions preferably falls within the range of;

θ−10°≦Θ≦θ+10°.

The substance having the accelerated oxidation suppressing function can be one selected from nitrogen, carbon, and compounds containing nitrogen or carbon. When annealing is performed in the presence of these impurities, the impurities may concentrate in a surface layer of the semiconductor substrate 1 to form SiN or SiC and thereby suppress the diffusion of oxygen atoms into the semiconductor substrate 1. Hence, carbon may suitably be ion-implanted instead of nitrogen. In addition, the introducing method of such a substance is not limited to the ion implantation method. For example, annealing may be performed in an atmosphere of such a substance to dope the semiconductor substrate 1 with the substance. In this case, the substance having the accelerated oxidation suppressing function is preferably selected from $NO_2$, $NO$, $NH_3$, and $C_xH_y$ (x and y are appropriate numbers) due to the above-described reason for accelerated oxidation suppression.

After the resist pattern 4 is removed by ashing or the like, annealing is performed in a nitrogen atmosphere (or an inert gas atmosphere) at 1,050° C. for 10 min to activate the implanted arsenic ions, thereby forming band-shape bit lines 5. These bit lines 5 serves also as the sources and drains of the flash memory.

Figure 12C:
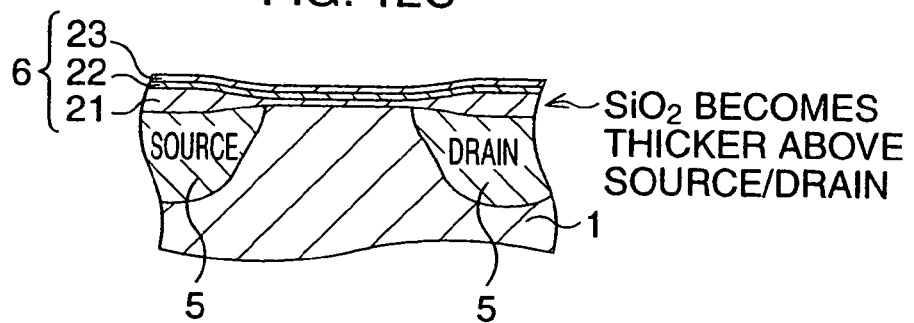

As shown in FIG. 12C, an ONO film 6 having a three-layer structure of silicon oxide film/silicon nitride film/silicon oxide film is formed on the semiconductor substrate 1.

More specifically, first, a silicon oxide film 21 having a thickness of about 7 to 8 nm is formed on the semiconductor substrate 1 by thermal oxidation. At this time, the portions of the silicon oxide film 21 above the bit lines 5 is acceleratingly oxidized through the annealing process due to the presence of arsenic ions in the bit lines 5, thereby increasing the thickness to about 30 to 50 nm. In this case, however, the accelerated-oxidation suppressing function of the implanted nitrogen ions further suppresses the increase in thickness of the silicon oxide film 21 in comparison with the first embodiment in which no nitrogen ion implantation is performed.

A silicon nitride film 22 having a thickness of about 5 nm is then formed on the silicon oxide film 21 through a CVD process at 600° C. to 800° C. A silicon oxide film. 23 having a thickness of about 10 nm is then formed on the silicon nitride film 22 through a CVD process. The ONO film 6 is formed thus.

The active region 2 of the memory cell region is masked by a resist, and the portions of the ONO film 6 present on the active regions of the peripheral circuit region are all removed using $CF_4+CHF_3/O_2$ gas or the like. After the resist on the active region 2 is removed, a gate insulating film (not shown) is formed on the active regions of the peripheral circuit region by thermal oxidation. At this time, since the bit lines 5 are covered with the ONO film 6, the influence of the annealing process in the formation of the gate insulating film is little. Any further accelerated oxidation of the silicon oxide film 21 at the portions above the bit lines 5 is suppressed, and an increase in thickness is hardly observed.

An amorphous silicon (DASi) film (not shown) doped with n-type impurities, in this example, phosphorus (P), at a concentration of 0.2 to $3 \times 10^{21}/cm^3$ and having a thickness of about 100 to 150 nm is formed in each active region of the memory cell region and the peripheral circuit region by CVD.

Figure 13A:
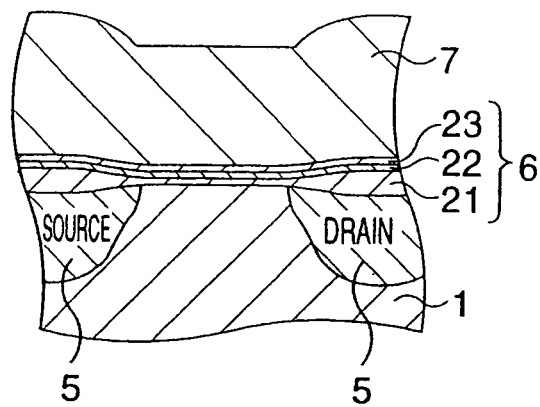
FIGS. 13A and 13B are schematic sectional views illustrating manufacturing steps of the buried bit line type flash memory according to the third embodiment, subsequent to FIG. 12C.

As shown in FIG. 13A, the DASi film is then annealed to form a polysilicon film, and the polysilicon film and the ONO film 6 are patterned by photolithography and subsequent dry etching, thereby forming band-shape word lines 7 that perpendicularly cross the bit lines 5 with the ONO film 6 being interposed between them and serve also as gate electrodes. At this time, a tungsten silicide (WSi) film may be formed on the polysilicon film to form word lines having a polycide structure and thereby decrease the resistance of electrical interconnections.

Figure 13B:
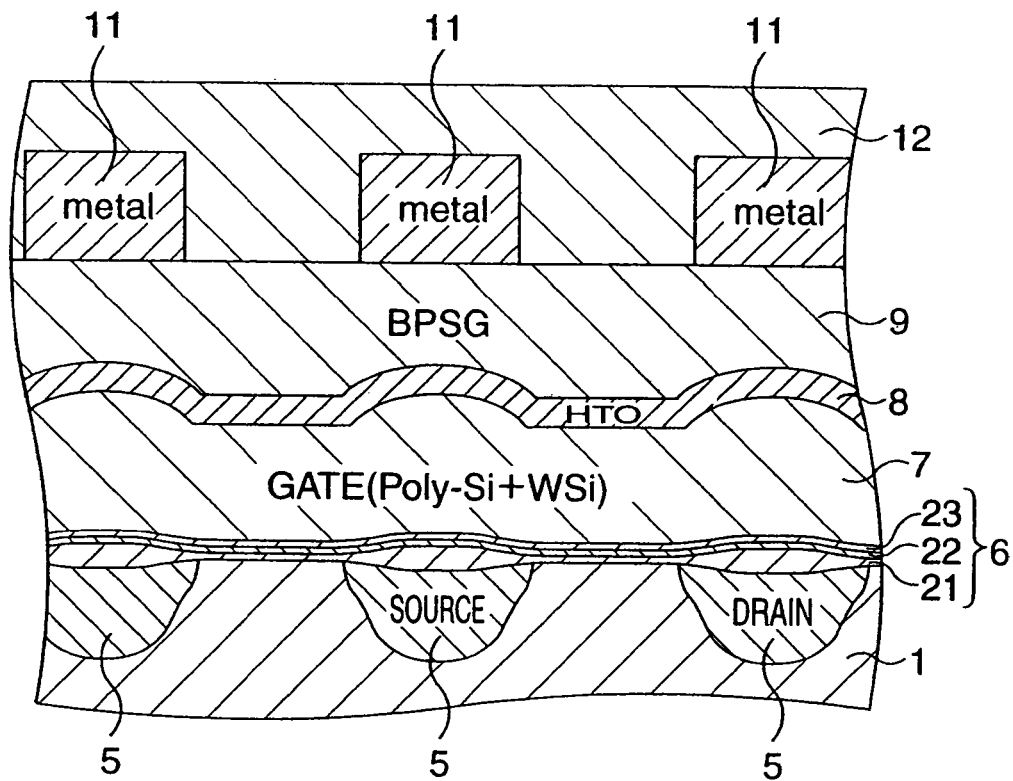
Figure 14A:
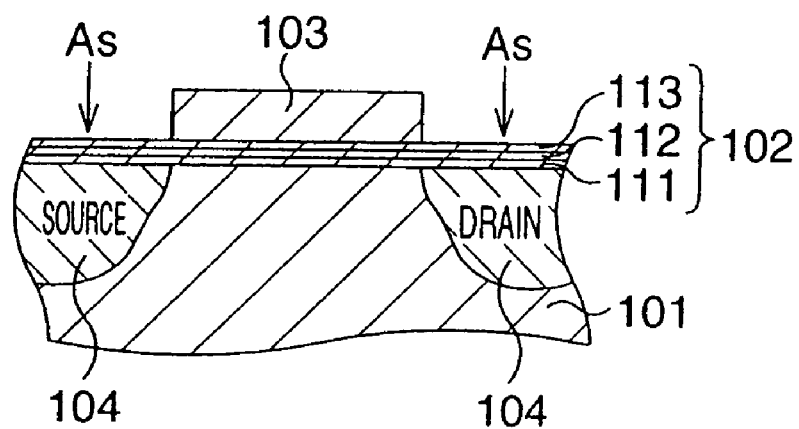
FIGS. 14A and 14B are schematic sectional views illustrating manufacturing steps of a buried bit line type flash memory according to prior art 1.
Figure 14B:
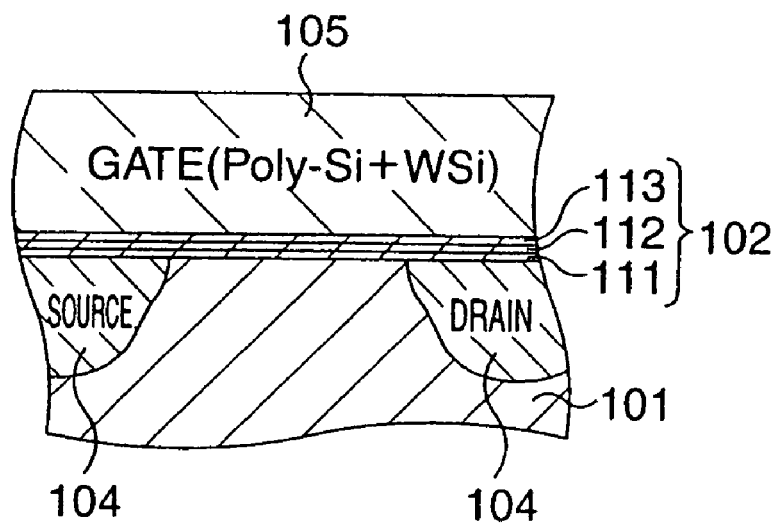
Figure 15A:
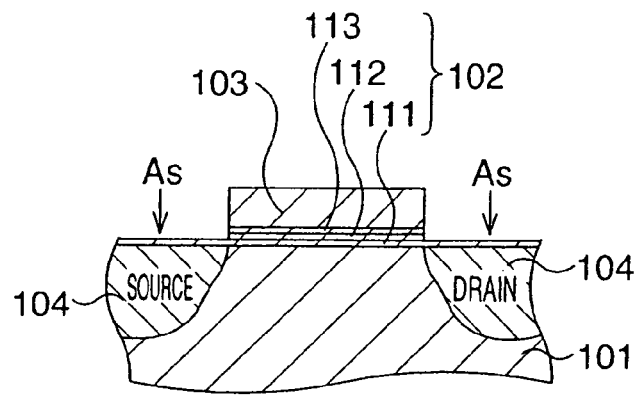
FIGS. 15A to 15C are schematic sectional views illustrating manufacturing steps of a buried bit line type flash memory according to prior art 2.
Figure 15B:
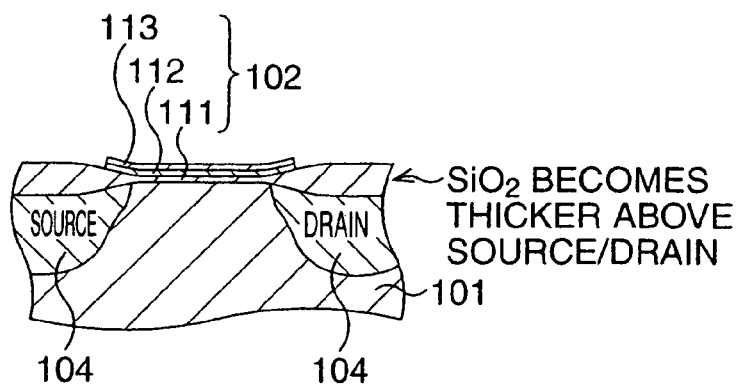
Figure 15C:
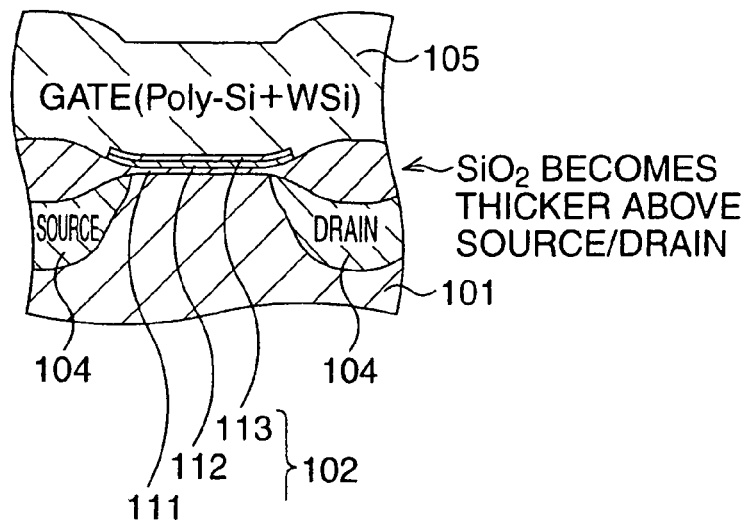
Figure 16A:
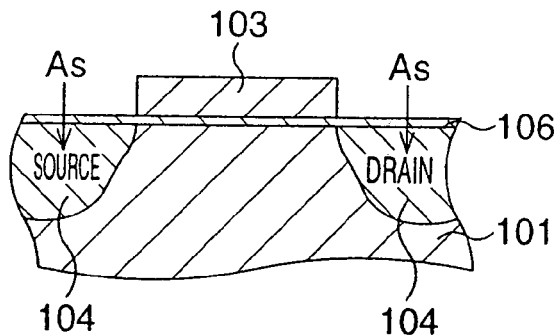
FIGS. 16A to 16D are schematic sectional views illustrating manufacturing steps of a buried bit line type flash memory according to prior art 3.
Figure 16B:
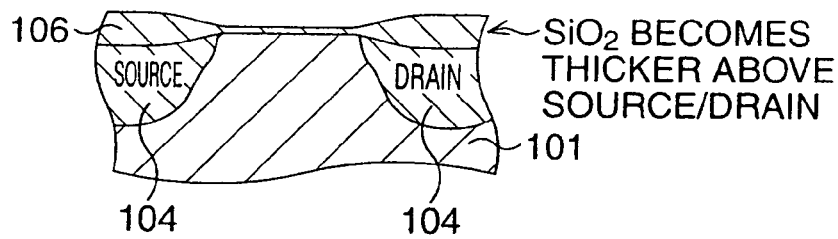
Figure 16C:
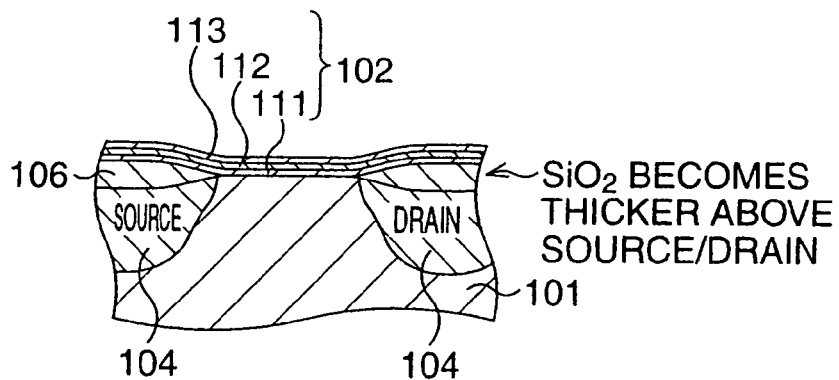
Figure 16D:
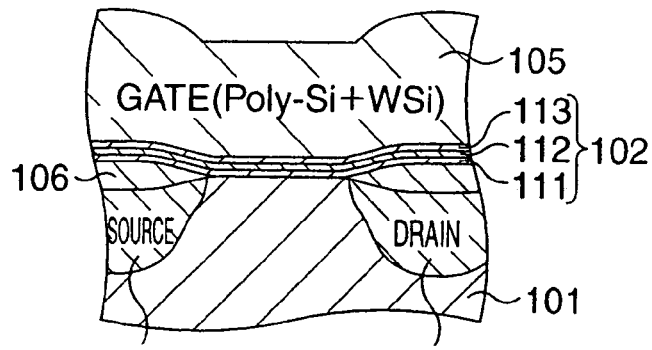

As shown in FIG. 13B, a high-temperature CVD oxide film (HTO film) 8 and a BPSG film 9 are sequentially formed in this order to cover the word lines 7. After contact holes (not shown) reaching the word lines 7 and the like are formed, an aluminum alloy film is formed by sputtering on the BPSG film 9, which has been planarized by a reflow process, so as to fill the contact holes. The aluminum alloy film is patterned by photolithography and subsequent dry etching to form upper interconnecting lines 11.

After that, a protective film 12 is formed to cover the upper interconnecting lines 11, and formation processes for an insulating interlayer, contact holes (via holes), and interconnecting lines are executed, thereby completing a buried bit line type flash memory.

As described above, in this embodiment, the ONO film 6 is formed after the impurities (arsenic) in the bit lines 5 are activated, and nitrogen (carbon) having the accelerated oxidation suppressing function is ion-implanted. At the time of formation of the ONO film 6, the silicon oxide film 21 as a component of the ONO film 6 is formed thick only above the bit lines 5 by accelerated oxidation, so that sufficient electrical insulation is ensured between the bit lines 5 and the word lines 7. In this case, in various annealing processes (formation of the gate insulating film in the peripheral circuit region and the like) after formation of the ONO film 6, since the thick portions of the silicon oxide film 21 above the bit lines 5 are covered with the other components (the silicon nitride film 22 and the silicon oxide film 23) of the ONO film 6, in addition, due to the accelerated oxidation suppressing function of nitrogen (carbon), the thick portions of the silicon oxide film 21 are not greatly acceleratingly oxidized, and bird's beak formation can be suppressed to a negligible level.

Additionally, in this embodiment, since nitrogen (carbon) is ion-implanted obliquely to the surface of the semiconductor substrate 1, nitrogen (carbon) can be introduced also into the end portions between the source and drain (channel) of the semiconductor substrate 1. Hence, nitrogen can be more deeply introduced into the channel ends, and thereby formation of bird's beaks is suppressed. At the time of nitrogen ion implantation, since the resist pattern 4 above the bit lines 5 serves as a mask, it prevents nitrogen ion implantation. At these portions, therefore, accelerated oxidation is not suppressed, and the silicon oxide film 21 becomes thick and may contribute to ensure a sufficient breakdown voltage. Hence, the interface level in the region where electrons are injected upon a data write operation is terminated, and the charge holding characteristic is improved.

That is, in this embodiment, throughout the process until the completion of the flash memory, the thickness of the ONO film 6 above the bit lines 5 is kept within the optimum range in which sufficient electrical insulation is ensured between the bit lines 5 and the word lines 7 and no bird's beak that may degrade the charge holding characteristic is formed. Additionally, the thickness can be controlled thinner by the accelerated oxidation suppressing function of nitrogen (carbon). Furthermore, since nitrogen (carbon) is obliquely ion-implanted, the charge holding characteristic can be further improved. Hence, a very reliable flash memory with improved transistor characteristics can be implemented.

The present invention is not limited to the above-described first to third embodiments. The present invention can be applied not only to single-level type memories that use data of "0" and "1", but also to binary memories that use data of "00", "01", "10", and "11", or to further multi-level type memories.

The present invention makes it possible to provide a semiconductor device, in particular, a semiconductor memory having a buried bit line structure, and a manufacturing method of the same, wherein electrical insulation between bit and word lines is sufficiently ensured and an excellent charge holding characteristic is realized by suppressing undesirable bird's beak formation.

What is claimed is:

1. A semiconductor device manufacturing method comprising:
    a first step of introducing impurities through a sacrificial film into a surface layer in an active region of a semiconductor substrate, annealing said semiconductor substrate in an inert gas atmosphere to form source and drain regions and entirely removing said sacrificial film;
    after said first step, a second step of forming a multilayer film so as to cover said active region, said multilayer film being made up from at least three layers, in which a first insulating film having a charge trap function is sandwiched by second and third insulating films from upper and lower sides of said first insulating film; and
    a third step of depositing an electrode material on said multilayer film and patterning said electrode material and said multilayer film to form a gate electrode, said gate electrode being located over said semiconductor substrate with said multilayer film being interposed between them.

2. The method according to claim 1, wherein, in said third step, said gate electrode is formed at the position between said source and drain regions over said semiconductor substrate with said multilayer film being interposed between said gate electrode and said source and drain regions.

3. The method according to claim 1, wherein, in said first step, after said impurities are introduced, a substance having an accelerated oxidation suppressing function is subsequently introduced into said active region, and then said semiconductor substrate is annealed to form said source and drain regions.

4. The method according to claim 3, wherein said substance having an accelerated oxidation suppressing function is one selected from the group of nitrogen, carbon, and compounds containing nitrogen or carbon.

5. The method according to claim 4, wherein, as said substance having an accelerated oxidation suppressing function, nitrogen or carbon ions are implanted into said active region.

6. The method according to claim 5, wherein said substance having an accelerated oxidation suppressing function is ion implanted obliquely to a surface of said active region.

7. The method according to claim 4, wherein said substance having an accelerated oxidation suppressing function is one selected from the group of NO2, NO, NH3, and CxHy (x and y are appropriate numbers), and annealing is performed in an atmosphere of said substance to dope said active region with said substance.

8. The method according to claim 1, wherein said first insulating film having a charge trap function is a silicon nitride film.

9. A method of manufacturing a semiconductor device comprising: a semiconductor substrate; source and drain regions formed in a surface layer of said semiconductor substrate; a multilayer film formed on said semiconductor substrate between said source and drain regions, said multilayer film being made up from at least three layers, in which a first insulating film having a charge trap function is sandwiched by second and third insulating films from upper and lower sides of said first insulating film; and a gate electrode formed on said multilayer film, said method comprising the steps of:

introducing impurities through a sacrificial film into a surface layer in an active region of said semiconductor substrate;

annealing said semiconductor substrate to form said source and drain regions;

entirely removing said sacrificial film; and forming said multilayer film.

10. The method according to claim 9, wherein said gate electrode is formed at the position between said source and drain regions over said semiconductor substrate with said multilayer film being interposed between said gate electrode and said source and drain regions.

11. The method according to claim 9, wherein, after said impurities are introduced, a substance having an accelerated oxidation suppressing function is subsequently introduced into said active region, and then said semiconductor substrate is annealed to form said source and drain regions.

12. The method according to claim 11, wherein said substance having an accelerated oxidation suppressing function is one selected from the group of nitrogen, carbon, and compounds containing nitrogen or carbon.

13. The method according to claim 12, wherein, as said substance having an accelerated oxidation suppressing function, nitrogen or carbon ions are implanted into said active region.

14. The method according to claim 13, wherein said substance having an accelerated oxidation suppressing function is ion implanted obliquely to a surface of said active region.

15. The method according to claim 12, wherein said substance having an accelerated oxidation suppressing function is one selected from the group of NO2, NO, NH3, and CxHy (x and y are appropriate numbers), and annealing is performed in an atmosphere of said substance to dope said active region with said substance.

16. The method according to claim 9, wherein said first insulating film having a charge trap function is a silicon nitride film.

* * * * *